US008329253B2

(12) United States Patent
Tsai et al.

(10) Patent No.: US 8,329,253 B2
(45) Date of Patent: Dec. 11, 2012

(54) METHOD FOR FORMING A TRANSPARENT CONDUCTIVE FILM BY ATOMIC LAYER DEPOSITION

(75) Inventors: Feng-Yu Tsai, Taipei (TW); Chun-Ting Chou, Taipei (TW)

(73) Assignee: National Taiwan University, Taipei (TW)

( * ) Notice: Subject to any disclaimer, the term of this patent is extended or adjusted under 35 U.S.C. 154(b) by 298 days.

(21) Appl. No.: 12/683,437

(22) Filed: Jan. 7, 2010

(65) Prior Publication Data

US 2011/0076513 A1 Mar. 31, 2011

(30) Foreign Application Priority Data

Sep. 28, 2009 (TW) ................................ 98132662 A

(51) Int. Cl.
*C23C 16/40* (2006.01)

(52) U.S. Cl. ......... 427/255.31; 427/255.32; 427/255.33; 427/255.34; 117/88; 117/104

(58) Field of Classification Search ............. 427/255.31, 427/255.32, 255.33, 255.34; 117/88, 104
See application file for complete search history.

(56) References Cited

U.S. PATENT DOCUMENTS

2004/0028952 A1* 2/2004 Cartier et al. ................. 428/698
2006/0017383 A1* 1/2006 Ishida et al. .................. 313/512
2006/0125048 A1* 6/2006 Miki ............................. 257/532
2006/0151823 A1* 7/2006 Govindarajan ............... 257/310
2006/0157694 A1* 7/2006 Lee et al. ........................ 257/43
2007/0163488 A1* 7/2007 Tois et al. ........................ 117/88
2007/0190684 A1* 8/2007 Jones ............................ 438/104
2008/0004670 A1* 1/2008 McVenes et al. ............... 607/36
2008/0020593 A1* 1/2008 Wang et al. .................... 438/782
2008/0096363 A1* 4/2008 Govindarajan ............... 438/396
2008/0274278 A1* 11/2008 Baumann et al. ............. 427/250
2009/0081256 A1* 3/2009 Langridge et al. ......... 424/236.1
2009/0211444 A1* 8/2009 Lissianski et al. .............. 95/107
2011/0020999 A1* 1/2011 Rocklein et al. .............. 438/381
2012/0091541 A1* 4/2012 Suchomel et al. ............ 257/411

OTHER PUBLICATIONS

Nistor, L.C. et al., "Thermal stability of atomic layer deposited Zr:Al mixed thin films: An in situ transmission electron microscopy study." J. Mater. Res., vol. 20, No. 7, Jul. 2005, pp. 1741-1750.*
Ritala, Mikko, et al., "Atomic Layer Deposition of Oxide Thin Films with Metal Alkoxides as Oxygen Sources". Science, vol. 288, Apr. 14, 2000, pp. 319-321.*
Vainonen-Ahlgren, E., et al., "Atomic layer deposition of hafnium and zirconium silicate thin films." Computationla Materials Science 27 (2003) pp. 65-69.*
Kim, Won-Kyu, et al., "Atomic Layer Chemical Vapor Deposition (ALCVD) of Hf and Zr Silicate and Aluminate High-k Gate Dielectric for Next Generation Nano Devices". Journal of Chemical Engineering of Japan, vol. 38, No. 8, pp. 578-587, 2005.*
Triyoso, D.H. et al., "Characteristics of Mixed Oxides and Nanolaminates of Atomic Layer Deposited HfO2-TiO2 Gate Dielectrics". Journal of the Electrochemical Society, 153 (9) G834-G839 (2006).*
Wiemer, C., et al., "Evolution of crystallographic ordering in Hf1-xAlxOy high-k dielectric deposited by atomic layer deposition." Applied Physics Letters, vol. 83, No. 25, Dec. 22, 2003, pp. 5271-5273.*

* cited by examiner

*Primary Examiner* — Bret Chen
(74) *Attorney, Agent, or Firm* — Pai Patent & Trademark Law Firm; Chao-Chang David Pai

(57) ABSTRACT

A method for forming a transparent conductive film by atomic layer deposition includes providing more than one kind of oxide precursor which is individually introduced into atomic layer deposition equipment through different sources, wherein the oxide precursors are consecutively introduced into the atomic layer deposition equipment at the same time, so that the oxide precursors are simultaneously present in the atomic layer deposition equipment, to form a uniform mixture of oxide precursors in a single adsorbate layer for settling onto a substrate in the atomic layer deposition equipment. Then, an oxidant is provided to react with the oxide precursors to form a single multi-oxide atomic layer. The above mentioned steps are repeated to form a plurality of multi-oxide atomic layers.

12 Claims, 3 Drawing Sheets

METHOD FOR FORMING A TRANSPARENT CONDUCTIVE FILM BY ATOMIC LAYER DEPOSITION

CROSS REFERENCE TO RELATED APPLICATIONS

This Application claims priority of Taiwan Patent Application No. 98132662, filed on Sep. 28, 2009, the entirety of which is incorporated by reference herein.

BACKGROUND OF THE INVENTION

1. Field of the Invention

The invention relates to a transparent conductive film, and more particularly to a transparent conductive film formed by an atomic layer deposition process.

2. Description of the Related Art

Generally, transparent conductive films are composed of oxides of at least two elements. The conventional processes for fabricating a mixture of several kinds of oxides to form the transparent conductive film comprise of a sputtering, a radio frequency magnetron sputtering, a direct current (DC) magnetron sputtering, a pulsed laser deposition, or a metal organic chemical vapor deposition process.

However, a temperature above 250° C. is used during the conventional processes to achieve good conductivity for the transparent conductive films. A high processing temperature is not appropriate for substrates made of flexible materials, for example plastic substrates or organic semiconductor materials. Therefore, the above mentioned processes for forming the transparent conductive films cannot be applied to flexible products. Also, fabrication costs for forming the transparent conductive films are high and processes are complicated due to a high vacuum environment requirement and an expensive laser or plasma equipment requirement. Moreover, it is difficult to form large-sized and uniform transparent conductive films by the above mentioned technologies.

Another process for forming the transparent conductive films is an atomic layer deposition process, which can be performed at a low process temperature and a low vacuum environment to form large-sized transparent conductive films.

However, transparent conductive films fabricated by the conventional atomic layer deposition process do not have several kinds of oxides mixed therein uniformly. Specifically, an atomic layer of a first oxide must be first deposited onto a substrate and then another atomic layer of a second oxide must be deposited on the atomic layer of the first oxide and so on, to form stacked atomic layers with all kinds of oxides which achieves a predetermined mixing ratio. Thus, the several kinds of oxides in the stacked multi-layered transparent conductive films fabricated by the conventional atomic layer deposition process are not uniformly mixed, decreasing conductivity thereof.

Therefore, a transparent conductive film which can be fabricated at a low process temperature and a low vacuum environment and a fabrication method thereof to form a large-sized and uniform film which achieves high conductivity are desired.

BRIEF SUMMARY OF THE INVENTION

An embodiment of the invention provides a transparent conductive film. The transparent conductive film comprises a plurality of oxide atomic layers. The plurality of oxide atomic layers includes more than one layer of multi-oxide atomic layers, wherein a single multi-oxide atomic layer contains more than one kind of uniformly mixed oxide.

Moreover, an embodiment of the invention provides a method for forming a transparent conductive film. The method comprises the steps: (a) providing atomic layer deposition equipment; (b) providing a substrate which is disposed in the atomic layer deposition equipment; (c) providing more than one kind of oxide precursor which is individually introduced into the atomic layer deposition equipment through different sources, wherein the oxide precursors are consecutively introduced into the atomic layer deposition equipment, so that the oxide precursors are simultaneously present in the atomic layer deposition equipment, forming a uniform mixture for settling onto the substrate; (d) providing an oxidant which is introduced into the atomic layer deposition equipment to react with the oxide precursors to form a single multi-oxide atomic layer; and (e) repeating the steps of (c) and (d) to form a plurality of multi-oxide atomic layers.

A detailed description is given in the following embodiments with reference to the accompanying drawings.

BRIEF DESCRIPTION OF THE DRAWINGS

The invention can be more fully understood by reading the subsequent detailed description and Examples with reference to the accompanying drawings, wherein.

DETAILED DESCRIPTION OF THE INVENTION

Figure 1:
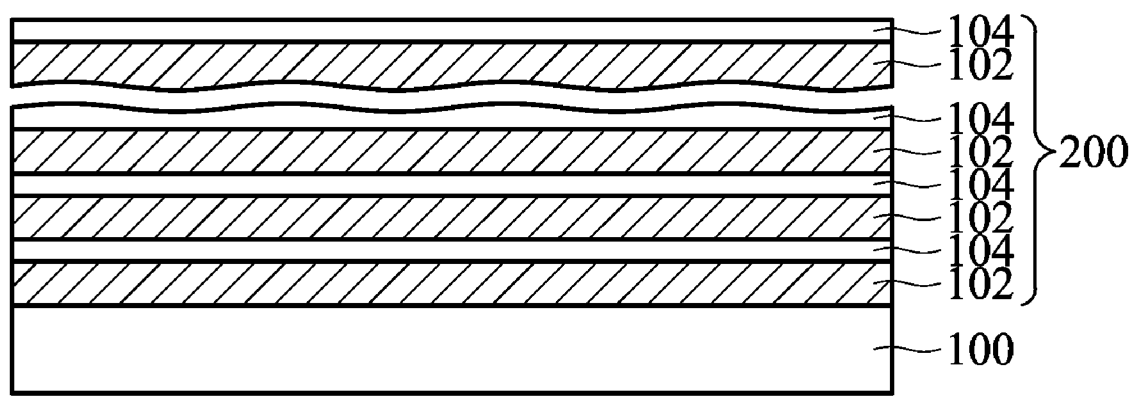
FIG. 1 shows a schematic cross section of a transparent conductive film according to the Comparative Examples 1 and 2 of the invention.

The following description is of the best-contemplated mode of carrying out the invention. The description is provided for illustrating the general principles of the invention and is not meant to be limiting. The scope of the invention is best determined by reference to the appended claims.

The invention utilizes an atomic layer deposition process to deposit a plurality of oxide atomic layers on a substrate and uses a mixture of several kinds of oxides to form a transparent conductive film. In an embodiment, at least a portion of the oxide atomic layers in the plurality of oxide atomic layers have more than one kind of uniformly mixed oxide in each single atomic layer.

In an embodiment, more than one kind of oxide precursor is provided through different sources. During the steps for forming a single atomic layer, oxide precursors are individually introduced into an atomic layer deposition equipment reaction chamber. The oxide precursors are consecutively introduced at the same time, and then settling onto a substrate to form an adsorbate layer of uniformly mixed oxide precursors. Then, an oxidant, for example, water vapor, is introduced into the atomic layer deposition equipment reaction chamber to oxidize the oxide precursors to form a single atomic layer having several kinds of uniformly mixed oxides, thereby forming a multi-oxide atomic layer.

Because several kinds of oxide precursors are provided through different sources to individually introduce into the atomic layer deposition equipment reaction chamber, before these oxide precursors are adsorbed onto the substrate, these oxide precursors would not mix directly to cause the other chemical reaction.

Moreover, because several kinds of oxide precursors are consecutively introduced into the atomic layer deposition equipment reaction chamber, so that the oxide precursors are simultaneously present in the reaction chamber and these several kinds of oxide precursors are simultaneously adsorbed onto the substrate to form the adsorbate layer of uniformly mixed oxide precursors, and then these oxide precursors are oxidized to form a single atomic layer having several kinds of uniformly mixed oxide, i.e. a single atomic layer of single the multi-oxides multi-oxide atomic layer.

The above mentioned steps for forming a single multi-oxide atomic layer are repeated to deposit a plurality of multi-oxide atomic layers and then a transparent conductive film is formed, wherein each single atomic layer has more than one kind of uniformly mixed oxide.

In the embodiments of the invention, a single multi-oxide atomic layer of the transparent conductive film may have two or more than oxides, wherein two to four kinds of uniformly mixed oxides are preferred. In a single multi-oxide atomic layer, these several kinds of oxides can be mixed by any ratio. In an embodiment, a single multi-oxide atomic layer may have a major oxide composition ratio of about 70 to 80 atom % and a secondary oxide composition ratio of about 20 to 30 atom %.

In an embodiment, each layer of the multi-oxide atomic the transparent conductive film may have the same composition of oxides. For example the oxides in each layer of the multi-oxide atomic layers may have the same composition and the same mixing ratio. In another embodiment, each layer of the multi-oxide atomic the transparent conductive film may have different compositions. For example, the transparent conductive film can be composed of two or more than multi-oxide atomic layers, and the different multi-oxide atomic layers may have different compositions of oxides, or the different multi-oxide atomic layers may have the same composition of oxides but different mixing ratios.

In another embodiment, a single-oxide precursor may be further introduced into the atomic layer deposition equipment reaction chamber before settling onto the substrate or the above mentioned multi-oxide atomic layer. Then, an oxidant, for example water vapor, is introduced into the atomic layer deposition equipment reaction chamber to oxidize the single-oxide precursor to form a single-oxide atomic layer. The single-oxide atomic layer may be stacked with the multi-oxide atomic layer alternately to form a transparent conductive film.

Moreover, in an embodiment, a thickness of the above mentioned single-oxide atomic layer may be different to that of the multi-oxide atomic layer. In an embodiment, the oxide in the single-oxide atomic layer may be the same as the one kind of oxide in the multi-oxide atomic layer. For example, the oxide in the single-oxide atomic layer may be the same as the major oxide in the multi-oxide atomic layer.

In an embodiment, the oxide of the single-oxide atomic layer and the oxides of the multi-oxide atomic layer may be zinc oxide, hafnium oxide, aluminum oxide, gallium oxide, boron oxide, indium oxide, tin oxide, other suitable oxides or the combinations thereof, for example ZnO, $HfO_2$, $Al_2O_3$, $Ga_2O_3$, $B_2O_3$, $In_2O_3$, $SnO_2$ or the combinations thereof.

In an embodiment, the precursors for the oxides of ZnO, $HfO_2$, $Al_2O_3$, $Ga_2O_3$, $B_2O_3$, $In_2O_3$ and $SnO_2$ comprise, for example, diethyl zinc (DeZn), tetrakis(dimethylamido) hafnium, trimethylaluminum (TMA), dimethylgallium isopropoxide, boron bromide ($BBr_3$), cyclopentadienyl indium and tin(IV) iodide ($SnI_4$), respectively, or other suitable precursors.

The fabrication methods and characters of the transparent conductive films of the invention are described in detail by several Examples and Comparative Examples as below:

COMPARATIVE EXAMPLE 1

A transparent conductive film composed of $HfO_2$ atomic layers and ZnO atomic layers, was fabricated.

The atomic layer deposition process of the Comparative Example 1 was performed in two phases. The first atomic layer deposition process fabricated the $HfO_2$ atomic layer, by the following four steps: (1) introducing a precursor of $HfO_2$ of tetrakis(dimethylamido) hafnium into the atomic layer deposition equipment reaction chamber; (2) vacuum-pumping the reaction chamber and then purging the reaction chamber with nitrogen gas; (3) introducing an oxidant of water vapor to the reaction chamber; and (4) vacuum-pumping the reaction chamber and then purging the reaction chamber with nitrogen gas to form an $HfO_2$ atomic layer with a thickness of 0.2 nm.

The second atomic layer deposition process fabricated the ZnO atomic layer, which basically included the same four steps as the first atomic layer deposition process, except for step (1), which was replaced by step (1) introducing a precursor of ZnO of diethyl zinc (DeZn) into the atomic layer deposition equipment reaction chamber to form an ZnO atomic layer with a thickness of 0.2 nm.

Thus, the above mentioned processes were utilized to form a transparent conductive film of the Comparative Example 1. Nineteen ZnO atomic layers were deposited and one $HfO_2$ atomic layer was deposited onto the substrate, in sequence. The depositions of the ZnO atomic layer and $HfO_2$ atomic layer were repeated, in sequence, until the transparent conductive film of Comparative Example 1 was formed with a total thickness of 200 nm. The fabrication for the transparent conductive film of Comparative Example 1 included 950 ZnO atomic layer deposition processes and 50 $HfO_2$ atomic layer deposition processes.

The resistivity of the transparent conductive film of Comparative Example 1 was $2.1\times10^{-3}$ Ω-cm as shown in Table 1. A schematic cross section of the transparent conductive film of the Comparative Example 1 is shown in FIG. 1, wherein ZnO atomic layers 102 and $HfO_2$ atomic layers 104 were alternately stacked onto a substrate 100 to form the transparent conductive film 200. The ZnO atomic layer 102 had a thickness of about 3.8 nm and the $HfO_2$ atomic layer 104 had a thickness of about 0.2 nm.

EXAMPLE 1

A transparent conductive film composed of several atomic layers, wherein a single atomic layer had $HfO_2$ and ZnO mixed uniformly therein, was fabricated.

Figures 2A, 2B:
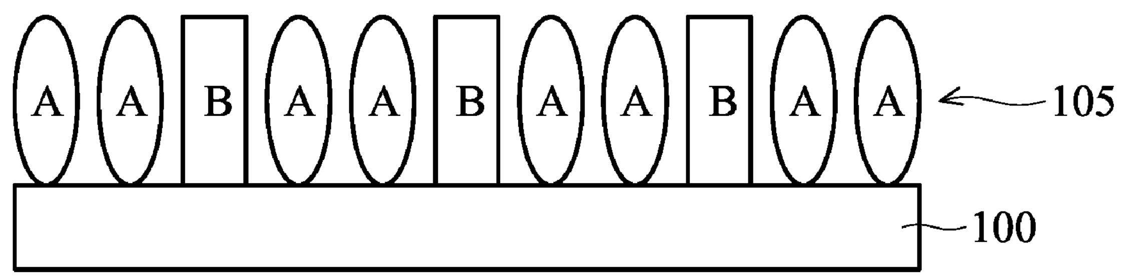
FIG. 2A shows a schematic cross section of an adsorbate layer of oxide precursors according to the Example 1 of the invention.
FIG. 2B shows a schematic cross section of a single multi-oxide atomic layer according to the Example 1 of the invention.

The atomic layer deposition process of Example 1 only uses one atomic layer deposition phase to form a uniformly mixed atomic layer having $HfO_2$ and ZnO. The atomic layer deposition process of Example 1 included the following four steps: (1) a precursor of ZnO of diethyl zinc (DeZn) and a precursor of $HfO_2$ of tetrakis(dimethylamido) hafnium was individually introduced into the atomic layer deposition equipment reaction chamber through two different sources. In the step (1), the precursors were consecutively introduced into the atomic layer deposition equipment reaction chamber, so that the oxide precursors were simultaneously present in the reaction chamber, forming a uniform mixture. A ratio of the amount of diethyl zinc (DeZn) to the amount of tetrakis (dimethylamido) hafnium in the mixture was controlled by a heating temperature of each precursor and the amount of time in which a valve is open for each precursor. In the embodiment of Example 1, the ratio of the amount of diethyl zinc (DeZn) to the amount of tetrakis(dimethylamido) hafnium was about 4:1. As shown in FIG. 2A, the two oxide precursors were uniformly mixed and settled onto a glass substrate 100 to form an adsorbate layer 105. The adsorbate layer 105 was formed by the following steps: (1) uniformly mixing a ZnO precursors A with $HfO_2$ precursors B; (2) vacuum-pumping the reaction chamber and then purging the reaction chamber with nitrogen gas; (3) introducing an oxidant of water vapor to oxidize the ZnO precursor and the $HfO_2$ precursor; and (4) vacuum-pumping the reaction chamber and then purging the reaction chamber with nitrogen gas to form a single atomic layer 106 of uniformly mixed $HfO_2$ and ZnO as shown in FIG. 2B. The single atomic layer 106 had a thickness of 0.2 nm and was composed of an oxide C (ZnO) and an oxide D ($HfO_2$) mixed uniformly.

Figure 3:
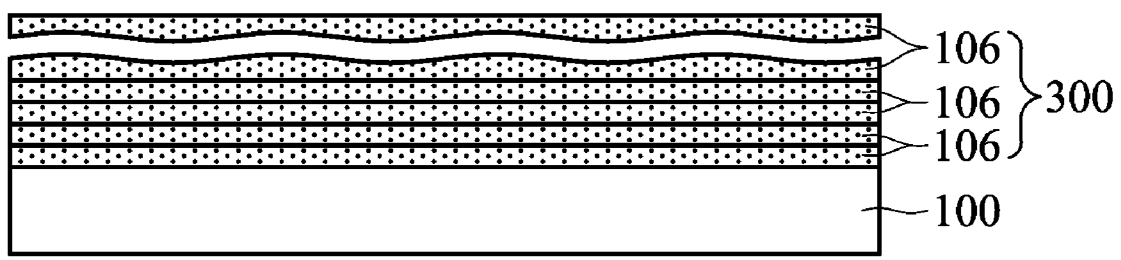
FIG. 3 shows a schematic cross section of a transparent conductive film according to the Example 1 of the invention.

Then, the above mentioned atomic layer deposition process for $HfO_2$ and ZnO was repeated 1000 times to form a transparent conductive film of the Example 1 having a total thickness of 200 nm. The resistivity of the transparent conductive film of the Example 1 was $1.3\times10^{-3}$ Ω-cm as shown in Table 1. A schematic cross section of the transparent conductive film of the Example 1 is shown as FIG. 3, wherein a ZnO and $HfO_2$ atomic layer 106 was stacked repeatedly onto the substrate 100 to form the transparent conductive film 300. The thickness of the ZnO and $HfO_2$ atomic layer 106 was about 0.2 nm.

Then, the transparent conductive film of the Example 1 was measured by X-ray photoelectron spectroscopy (XPS) to analyze surface elements thereof. The results showed that an atom ratio of Zn:Hf:O for the transparent conductive film of the Example 1 was about 41.34:11.9:45.4. Thus, a single the transparent conductive film of the Example 1 having oxides of ZnO and $HfO_2$ and a ratio of ZnO to $HfO_2$ of about 4:1 was formed. Moreover, the resistivities of the transparent conductive film of the Example 1 at several locations thereof were measured. The conductivities of the transparent conductive film of the Example 1 at the several measured locations were substantially the same at about $1.3\times10^{-3}$ Ω-cm. Thus, the two oxides were uniformly distributed over the single atomic layer of the transparent conductive film of the Example 1.

EXAMPLE 2

A transparent conductive film composed of a ZnO atomic layer and an atomic layer having $HfO_2$ and ZnO mixed uniformly therein, was fabricated.

The atomic layer deposition process of the Example 2 was performed in two phases. The first atomic layer deposition process fabricated the ZnO atomic layer, by the same steps as the above mentioned steps for fabricating the ZnO atomic layer of the Comparative Example 1. The thickness of a single ZnO atomic layer was about 0.2 nm.

The second atomic layer deposition process fabricated a uniformly mixed $HfO_2$ and ZnO atomic layer, by the same steps as the above mentioned steps for fabricating the $HfO_2$ and ZnO atomic layer of the Example 1. The thickness of a single $HfO_2$ and ZnO atomic layer was about 0.2 nm.

The above mentioned atomic layer deposition processes were used to form a transparent conductive film of the Example 2. Four ZnO atomic layers were deposited and one layer of $HfO_2$ and ZnO atomic layer was deposited on the substrate, in sequence. The depositions of the ZnO atomic layer and the $HfO_2$ and ZnO atomic layer were repeated in sequence until the transparent conductive film of Example 2 was formed with a total thickness of 200 nm. The fabrication of the transparent conductive film of Example 2 included 800 ZnO atomic layer deposition processes and 200 $HfO_2$ and ZnO atomic layer deposition processes, wherein every four ZnO atomic layer deposition processes was combined with one $HfO_2$ and ZnO atomic layer deposition process.

Figure 4:
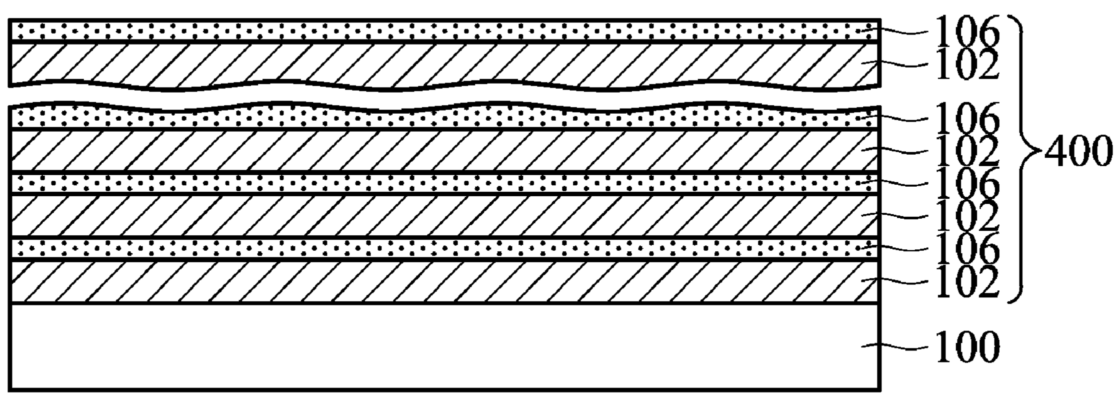
FIG. 4 shows a schematic cross section of a transparent conductive film according to the Examples 2 and 3 of the invention.

The resistivity of the transparent conductive film of Example 2 was $8.4\times10^{-4}$ Ω-cm as shown in Table 1. A schematic cross section of the transparent conductive film of the Example 2 is shown in FIG. 4, wherein the ZnO atomic layers 102 and the $HfO_2$ and ZnO atomic layers 106 were alternately stacked onto a substrate 100 to form a transparent conductive film 400. The ZnO atomic layer 102 had a thickness of about 0.8 nm and the $HfO_2$ and ZnO atomic layer 106 had a thickness of about 0.2 nm.

COMPARATIVE EXAMPLE 2

A transparent conductive film composed of $Al_2O_3$ atomic layers and ZnO atomic layers, was fabricated.

The atomic layer deposition process of the Comparative Example 2 was performed in two phases. The first atomic layer deposition process fabricated the $Al_2O_3$ atomic layer by the following four steps: (1) introducing a precursor of $Al_2O_3$, i.e. trimethylaluminum, into the atomic layer deposition equipment reaction chamber; (2) vacuum-pumping the reaction chamber and then purging the reaction chamber with nitrogen gas; (3) introducing an oxidant of water vapor to the reaction chamber; and (4) vacuum-pumping the reaction chamber and then purging the reaction chamber with nitrogen gas to form an $Al_2O_3$ atomic layer with a thickness of 0.2 nm.

The second atomic layer deposition process fabricated the ZnO atomic layer, which basically included the same four steps as the first atomic layer deposition process, except for step (1), which was replaced by step (1) introducing a precursor of ZnO, i.e. diethyl zinc (DeZn) into the atomic layer deposition equipment reaction chamber to form an ZnO atomic layer with a thickness of 0.2 nm.

The above mentioned atomic layer deposition processes were used to form a transparent conductive film of the Comparative Example 2. Nineteen ZnO atomic layers were deposited and one layer of $Al_2O_3$ atomic layer was deposited on the substrate, in sequence. The deposition of the ZnO atomic layer and $Al_2O_3$ atomic layer were repeated in sequence until the transparent conductive film of Comparative Example 2 was formed with a total thickness of 200 nm. The fabrication of the transparent conductive film of Comparative Example 2 included 950 ZnO atomic layer deposition processes and 50 $Al_2O_3$ atomic layer deposition processes, wherein every nineteen ZnO atomic layer deposition processes was combined with one $Al_2O_3$ atomic layer deposition process.

The resistivity of the transparent conductive film of Comparative Example 2 was $2.2\times10^{-3}$ Ω-cm as shown in Table 1. A schematic cross section of the transparent conductive film of the Comparative Example 2 is shown as FIG. 1, wherein ZnO atomic layers 102 and $Al_2O_3$ atomic layers 104 were alternately stacked onto a substrate 100 to form the transparent conductive film 200. The ZnO atomic layer 102 had a thickness of about 3.8 nm and the $Al_2O_3$ atomic layer 104 had a thickness of about 0.2 nm.

EXAMPLE 3

A transparent conductive film composed of a ZnO atomic layer and an atomic layer having $Al_2O_3$ and ZnO mixed uniformly therein, was fabricated.

The atomic layer deposition process of the Example 3 was performed in two phases. The first atomic layer deposition process fabricated the ZnO atomic layer, by the same steps as the above mentioned steps for fabricating the ZnO atomic layer of the Comparative Example 2. The thickness of a single ZnO atomic layer was about 0.2 nm.

The second atomic layer deposition process fabricated the uniformly mixed $Al_2O_3$ and ZnO atomic layer by the following four steps: (1) individually introducing a precursor of ZnO, i.e. diethyl zinc (DeZn) and a precursor of $Al_2O_3$, i.e. trimethylaluminum, into the atomic layer deposition equipment reaction chamber through two different sources. In the step (1), the two precursors were consecutively introduced into the reaction chamber, so that the oxide precursors were simultaneously present in the reaction chamber, forming a uniform mixture. A ratio of the amount of diethyl zinc (DeZn) to the amount of trimethylaluminum in the mixture was controlled by a heating temperature of each precursor and the amount of time in which a valve is open for each precursor. In the embodiment of Example 3, the ratio of the amount of diethyl zinc (DeZn) to the amount of trimethylaluminum was about 30:1. The two oxide precursors were mixed uniformly and settled onto a glass substrate to form an adsorbate layer; (2) vacuum-pumping the reaction chamber and then purging the reaction chamber with nitrogen gas; (3) introducing an oxidant of water vapor to oxidize the ZnO precursor and the $Al_2O_3$ precursor; and (4) vacuum-pumping the reaction chamber and then purging the reaction chamber with nitrogen gas to form a uniformly mixed single $Al_2O_3$ and ZnO atomic layer.

The above mentioned atomic layer deposition processes were used to form a transparent conductive film of the Example 3. Nineteen ZnO atomic layers were deposited and one layer of $Al_2O_3$ and ZnO atomic layer was deposited on the substrate, in sequence. The depositions of the ZnO atomic layer and the $Al_2O_3$ and ZnO atomic layer were repeated in sequence until the transparent conductive film of Example 3 was formed with a total thickness of 200 nm. The fabrication of the transparent conductive film of Example 3 included 950 ZnO atomic layer deposition processes and 50 $Al_2O_3$ and ZnO atomic layer deposition processes, wherein every nineteen ZnO atomic layer deposition processes was combined with one $Al_2O_3$ and ZnO atomic layer deposition process.

The resistivity of the transparent conductive film of Example 3 was $9.9\times10^{-4}$ Ω-cm as shown in Table 1. A schematic cross section of the transparent conductive film of the Example 3 is shown as FIG. 4, wherein the ZnO atomic layers 102 and the $Al_2O_3$ and ZnO atomic layers 106 were alternately stacked onto a substrate 100 to form a transparent conductive film 400. The ZnO atomic layer 102 had a thickness of about 0.8 nm and the $Al_2O_3$ and ZnO atomic layer 106 had a thickness of about 0.2 nm.

In the Examples 1-3 and the Comparative Examples 1-2, the temperature of the glass substrate was maintained at 150° C.

Table 1. the characters of the transparent conductive films of the Examples and the Comparative Examples

TABLE 1

| transparent conductive film | thickness (nm) | sheet resistance (Ω/□) | resistivity (Ω-cm) |
|---|---|---|---|
| Comparative Example 1 | 200 | 105 | $2.1 \times 10^{-3}$ |
| Example 1 | 200 | 65 | $1.3 \times 10^{-3}$ |
| Example 2 | 200 | 42 | $8.4 \times 10^{-4}$ |
| Comparative Example 2 | 200 | 110 | $2.2 \times 10^{-3}$ |
| Example 3 | 200 | 49.5 | $9.9 \times 10^{-4}$ |

As shown in the results of Table 1, the resistivities of the transparent conductive films of the Examples are lower than that of the Comparative Examples. Accordingly, the transparent conductive films having a single uniformly mixed $Al_2O_3$ and ZnO atomic layer or a single uniformly mixed $HfO_2$ and ZnO atomic layer had higher conductivity than that of the transparent conductive films having only one kind of oxide in a single atomic layer.

Meanwhile, the distribution and the mixing ratio of the several oxides in the transparent conductive film of the invention were controlled accurately through adjusting the conditions, the sequences and the atomic layer deposition processes. Thus, the several kinds of oxides were uniformly distributed in the transparent conductive films and the conductivities of the transparent conductive films of the invention were enhanced.

Thus, the transparent conductive films of the invention have several advantages: (1) a simple fabrication process as the transparent conductive film can be formed by a single atomic layer deposition process, which decreases costs; (2) flexibility to uniformly mix various kinds of oxides, which increases applicability; (3) low process temperature, e.g. below 180° C., which is suitable for flexible electronic products.

The transparent conductive films of the invention can be applied to various photoelectric and electronic products. For example, transparent electrodes of solar cells, transparent electrodes of displays, touch panels, anti-electrostatic films, heat reflective lens, and elements of integrated circuits. Also, the transparent conductive films of the invention can be applied to flexible electronic products, such as flexible displays, flexible solar cells and flexible integrated circuits.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a transparent conductive film, comprising:

(a) providing atomic layer deposition equipment;

(b) providing a substrate which is disposed in the atomic layer deposition equipment;

(c) providing more than one kind of oxide precursor which is individually introduced into the atomic layer deposition equipment through different sources, wherein the oxide precursors are consecutively introduced into the atomic layer deposition equipment without interruption by an introducing step of the oxide precursors, so that the oxide precursors are simultaneously present in the atomic layer deposition equipment and the substrate is exposed to the more than one kind of oxide precursor simultaneously, to form a uniform mixture of oxide precursors in a single adsorbate layer for settling onto the substrate;

(d) providing an oxidant which is introduced into the atomic layer deposition equipment for reacting with the oxide precursors to form a single multi-oxide atomic layer;

(e) providing a single-oxide precursor which is introduced into the atomic layer deposition equipment and providing an oxidant for reacting with the single-oxide precursor to form a single-oxide atomic layer; and (f) repeating the steps of (c) to (e) to form a plurality of multi-oxide atomic layers and a plurality of single-oxide atomic layers.

2. The method as claimed in claim 1, wherein the single-oxide atomic layer is alternately stacked with the multi-oxide atomic layer.

3. The method as claimed in claim 1, wherein the oxide in the single-oxide atomic layer is the same as the one kind of oxide in the multi-oxide atomic layer.

4. The method as claimed in claim 1, wherein the oxide of the single-oxide atomic layer is selected from the group consisting of zinc oxide, hafnium oxide, aluminum oxide, gallium oxide, boron oxide, indium oxide and tin oxide.

5. The method as claimed in claim 4, wherein the oxide is selected from the group consisting of ZnO, $HfO_2$, $Al_2O_3$, $Ga_2O_3$, $B_2O_3$, $In_2O_3$ and $SnO_2$.

6. The method as claimed in claim 1, wherein the single-oxide precursor is selected from the group consisting of diethyl zinc, tetrakis(dimethylamido) hafnium, trimethylaluminum, dimethylgallium isopropoxide, boron bromide, cyclopentadienyl indium and tin iodide.

7. The method as claimed in claim 1, wherein the compositions of the oxides in the plurality of multi-oxide atomic layers are the same.

8. The method as claimed in claim 1, wherein the compositions of the oxides in the plurality of multi-oxide atomic layers are different.

9. The method as claimed in claim 1, wherein the oxides of the multi-oxide atomic layer are selected from the group consisting of zinc oxide, hafnium oxide, aluminum oxide, gallium oxide, boron oxide, indium oxide and tin oxide.

10. The method as claimed in claim 9, wherein the oxides are selected from the group consisting of ZnO, $HfO_2$, $Al_2O_3$, $Ga_2O_3$, $B_2O_3$, $In_2O_3$ and $SnO_2$.

11. The method as claimed in claim 1, wherein the oxide precursors are selected from the group consisting of diethyl zinc, tetrakis(dimethylamido) hathium, trimethylaluminum, dimethylgallium isopropoxide, boron bromide, cyclopentadienyl indium and tin iodide.

12. The method as claimed in claim 1, wherein the substrate is maintained at a temperature below 180° C.

* * * * *